United States Patent [19]
Blish, II et al.

[11] Patent Number: 5,882,738
[45] Date of Patent: Mar. 16, 1999

[54] APPARATUS AND METHOD TO IMPROVE ELECTROMIGRATION PERFORMANCE BY USE OF AMORPHOUS BARRIER LAYER

[75] Inventors: Richard C. Blish, II, Saratoga; Bryan Tracy, Oakland, both of Calif.

[73] Assignee: Advanced Micro Devices, Inc., Sunnyvale, Calif.

[21] Appl. No.: 994,356

[22] Filed: Dec. 19, 1997

[51] Int. Cl.$^6$ ............................................. C23C 14/04
[52] U.S. Cl. ........................ 427/526; 427/123; 427/250; 427/255; 427/261; 427/299; 427/399; 427/404; 427/527; 427/531; 428/614; 428/620; 428/636; 428/641; 428/642; 437/233; 437/245
[58] Field of Search ...................... 427/526, 527, 427/531, 123, 250, 255, 261, 299, 399, 404; 428/614, 620, 636, 641, 642; 437/233, 245

*Primary Examiner*—Bernard Pianalto
*Attorney, Agent, or Firm*—LaRiviere, Grubman & Payne

[57] ABSTRACT

An ion implant process is disclosed for forming an amorphous structure in a semiconductor metallization barrier layer, which barrier may be a pure metal barrier, such as titanium, tantalum, tungsten, or metal compound barrier, such as titanium nitride, or titanium-tungsten. The implant is preferably an ion of the barrier metal being used, which is implanted such that an amorphous (texture-less non-crystalline) layer is produced. Other implant species, such as nitrogen or noble gases, such as neon or argon may also be used. Subsequent deposition of the interconnect metallization (typically Al or Cu) results in an interconnect metal structure having a high degree of texture which is characterized by a very narrow distribution of crystallographic orientations in the Al or Cu film. The highly textured Al or Cu metallization results in optimizing the interconnect metal for maximum electromigration performance. The implant energy is chosen such that the tail of the Gaussian distribution of ion's stopping distances extends above the top of the barrier metal film. The ion implantation forms a non-crystalline metal structure in the metal barrier film such that there is no crystalline metal to act as a "seed" for nucleation during the metallization deposition and subsequent processing. Thus, the final interconnect metallization texture (Al or Cu) will not be governed by the texture of the underlying metal barrier layer which results in an optimized interconnect metal structure with maximum electromigration performance characteristics.

19 Claims, 4 Drawing Sheets

APPARATUS AND METHOD TO IMPROVE ELECTROMIGRATION PERFORMANCE BY USE OF AMORPHOUS BARRIER LAYER

TECHNICAL FIELD

The present invention relates to integrated circuits and fabrication techniques for improving electromigration lifetime. More particularly, the present invention relates to integrated circuits and fabrication techniques for improving electromigration lifetime by utilizing amorphous metallization techniques. Even more particularly, the present invention relates to integrated circuits and fabrication techniques for improving electromigration lifetime by utilizing amorphous metallization as the underlying barrier layer in the device.

BACKGROUND OF THE INVENTION

It is fundamental during the fabrication of semiconductor wafer to put one or more layers of conducting metal on the wafer surface and to include a patterning process that facilitates electrical connections between circuit components. The process is termed metallization. Although copper and gold are highly conductive metals and have been utilized in metallization processes, aluminum has evolved as the preferred conducting metal in the semiconductor fabrication process. A treatment of the metallization process can be found in a text book entitled: *Microchip Fabrication, A Practical Guide to Semiconductor Processing.*, 3rd edition, by Peter Van Zant, McGraw-Hill, p.389–418. As discussed in the foregoing reference, aluminum suffers a problem called electromigration. The problem occurs when long, narrow leads of aluminum carry large currents over long distances, as is the situation in VLSI and ULSI circuits. Heat generated by the flowing current sets up a thermal gradient along the lead. The aluminum in the lead becomes mobile and diffuses along the direction of the current flow. The effect is to produce voids at one end and a surfeit of material at the other. In the extreme, the lead can become completely separated. The prior art teaches that electromigration may be minimized by depositing an alloy of aluminum and copper, or an alloy of aluminum and titanium on the silicon dioxide surface. Drawbacks for aluminum alloys, versus pure aluminum, are increased complexity for the deposition equipment and process, different etch rates, and an increase in film resistivity compared to the pure aluminum. The amount of the resistance increase varies with the alloy composition and heat treatments, but can be as much as 25 to 30 percent. Interdiffusion occurs when two materials are heated in contact with each other at temperatures much lower than their individual melting points. For example, if pure aluminum was put in contact with pure silicon (a pn junction), a great deal of silicon would be extracted from the small silicon contact and diffused into the aluminum, producing a crystallographically defined pit. If this process is permitted to proceed, the pit depth will be larger than junction depth, and these aluminum "spikes" short at the junction. As discussed in the textbook reference, both titanium-tungsten (TiW) and titanium nitride (TiN) layers are used to form barrier layers. TiW is sputter-deposited onto the wafer and into the open contacts before the aluminum or aluminum alloy deposition takes place. The TiW deposited on the field oxide is removed from the surface during the aluminum etch step. Sometimes a first layer of platinum silicide is formed on the exposed silicon before the TiW is deposited. According to the textbook reference, a titanium nitride layer may be formed by evaporation, sputtering, chemical vapor deposition (CVD), thermal nitridation in nitrogen or ammonia atmosphere. TiN, however, does require an underlying layer of titanium to promote adhesion with silicon substrates.

From a more in-depth point of view, electromigration lifetime performance is well known to be a function of trace width, aluminum grain size and orientation (texture) due to metal mobility in grain boundaries. This mobility is driven by the electron "wind," (momentum transfer from the electrons at high current density and temperature) and particularly to/from grain boundary "triple points." During electromigration, the aluminum in the narrow lead becomes mobile and diffuses along the direction of the electron flux and thermal gradients. Aluminum lines with a "bamboo" structure (grain size larger than line width and grain boundaries perpendicular to edge of line) have superior electromigration performance as compared to a randomly oriented small grain size. A single crystal metallization (no grain boundaries) would be the optimal metallization texture. Alternatively, if the underlying metal barrier forced the aluminum to be amorphous, (no long range order), there would be no grain boundaries to serve as high speed diffusion paths. The idea of using an amorphous metal barrier for improving the electromigration lifetime has been disclosed in a paper entitled: "Improvement of Electromigration Lifetime using Hyper-Textured Aluminum Formed on the Amorphous Tantalum-Aluminum Underlayer," by H. Toyoda et al. of Toshiba, IRPS (1994), pp. 178–184. Toyoda et al. discloses that an amorphous tantalum (Ta) barrier layer can produce superior texture to improve aluminum (Al) electromigration lifetime. However, the Toyoda et al. reference fails to disclose how the amorphous tantalum (Ta) barrier layer would be formed.

Accordingly, the primary object of the present invention is to provide a fabrication process for minimizing electromigration in the metal leads used in interconnecting circuit components in a semiconductor integrated circuit.

A particular object of the present invention is to provide a metallization fabrication process for producing an amorphous metal barrier such that the final interconnect metallization texture (Al or Cu) will be influenced by the underlying barrier layer and thus producing an interconnect metal texture that optimizes electromigration performance.

A related object is to provide a semiconductor circuit apparatus having an amorphous metal barrier layer and interconnecting metal leads formed in accordance with the foregoing objects.

BRIEF SUMMARY OF THE INVENTION

The foregoing objects are accomplished by providing an ion implant into the metallization barrier metal. The implant is preferably an ion of the barrier metal itself being used, termed a self-implant, which is implanted with an energy such that an amorphous (texture-less non-crystalline) layer is produced. Subsequent deposition of the interconnect metallization (typically Al or Cu) can then be optimized for best texture, which comprises a narrow distribution of crystallographic orientations of the Al or Cu, to maximize electromigration performance. The present invention provides an ion implantation fabrication process for forming an amorphous metal, or amorphous compound, barrier layer (such as an amorphous titanium or tantalum, titanium-tungsten (TiW) and titanium nitride (TiN) at the barrier metal/metallization interface. The metals utilized in the process are generally refractory metals (such as titanium, tantalum) selected with a very high melting point, typically >1500° C., and which will be sufficiently stable at ordinary metallization processing temperatures, typically up to 450° C., to remain amorphous. The circuit interconnecting metal lead is usually a high conductivity metal such as aluminum (Al) or copper (Cu). The preferred process in accordance with the present invention comprising a step of irradiating the barrier metal film prior to deposition of the Al or Cu with an ionic version of the barrier metal. The implanting energy is chosen in the range of 20–200 KeV such that the tail of the Gaussian distribution of ion's stopping distances extends through the top of the barrier metal film. The ion implantation forms a non-crystalline structure in the metal barrier film such that there is no crystalline metal to act as a "seed" for nucleation during the metallization deposition and subsequent processing. Thus, the final interconnect metallization texture (Al or Cu) will be influenced by the amorphous nature of the metal barrier layer, so the barrier would supply no long range order, and then interconnection metallization deposition parameters can be chosen to minimize texture variation which will improve electromigration lifetime by a factor of ten (10), see H. Toyoda et al. referenced above.

As an alternative, if an implant of the host metal ion into the barrier metallization can not be performed i.e. ($Ti^+$ into Ti for Al or Cu), or ($Ta^+$ into Ta for Cu, etc.), then the nitrogen ion $N^+$ implantation can be utilized as an alternative ion implant species. This alternative implantation process comprises making the dose of the nitrogen ion $N^+$ in the range of $10^{16}$ atoms per $cm^3$ and implanting the $N^+$ into the barrier metal film to convert its crystalline structure to an amorphous structure. While nitrogen implantation can be used as a secondary method of producing an amorphous barrier metal (a self-implant being preferred), it is also possible to use other species which are compatible with semiconductor processing. Examples include the noble gases argon (A), krypton (Kr), neon (Ne), xenon (Xe) and the ion of the overlying metal layer usually aluminum or copper. In summary, many different implant species may be used to amorphize the barrier metal including self-implants, N, inert gases, and overlying metallization ions, typically Al or Cu.

Semiconductor products having an amorphous underlying barrier metal not only have improved reliability due to minimized electromigration, but also allows a higher current density, which further facilitates semiconductor products having smaller size, more speed, circuit density and functionality. Further, amorphous materials lend themselves to more accurate definition during etching (precision of critical dimension etc) than crystalline materials. A further advantage of having an amorphous metal barrier is that the overlying aluminum or copper film is significantly smoother. This characteristic makes them more resistant to a variety of back end defects, such as developer-induced corrosion.

Other features of the present invention are disclosed or apparent in the section entitled: "DETAILED DESCRIPTION OF THE INVENTION."

Figure 1:
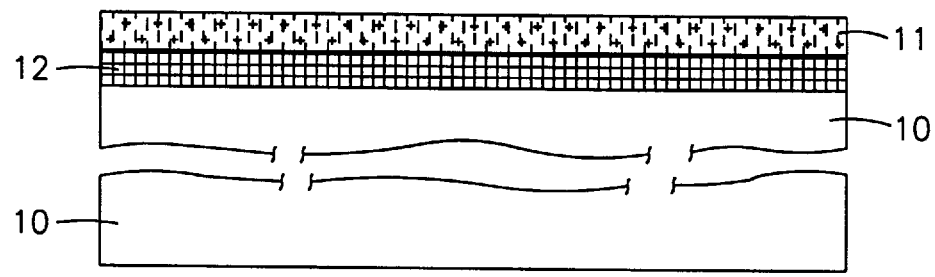
FIG. 1 shows a generalized cross-section of a silicon semiconductor substrate apparatus fabricated prior to a metallization stage and having barrier metal ions implanted into the barrier metal layer forming an amorphous structure in the metal barrier in accordance with the present invention.

Reference numbers refer to the same or equivalent parts of the present invention throughout the several figures of the drawing.

DETAILED DESCRIPTION OF THE INVENTION

Figure 2A:
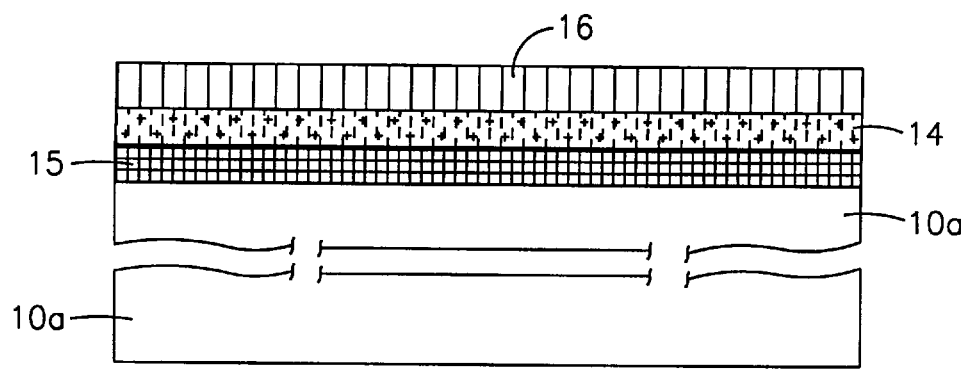
FIG. 2a shows a cross-section of a metallized silicon semiconductor substrate apparatus formed having titanium ions implanted into a titanium barrier layer underlying aluminum interconnect leads.
Figure 2B:
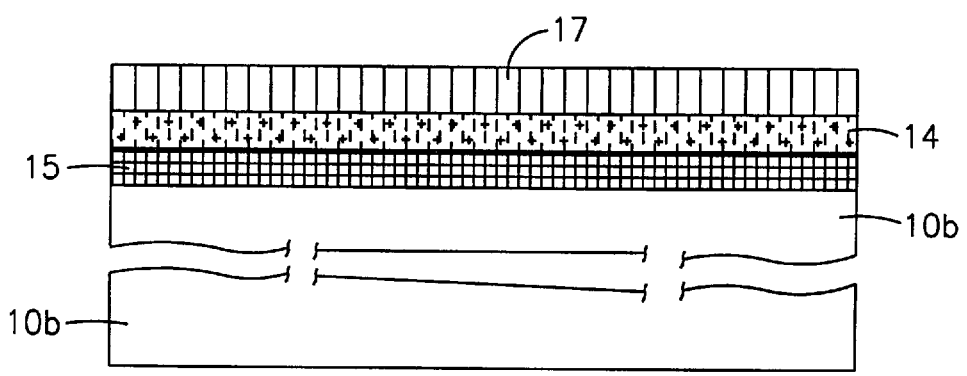
FIG. 2b shows a cross-section of a metallized silicon semiconductor substrate apparatus formed having titanium ions implanted into a titanium barrier layer underlying copper interconnect leads.
Figure 2C:
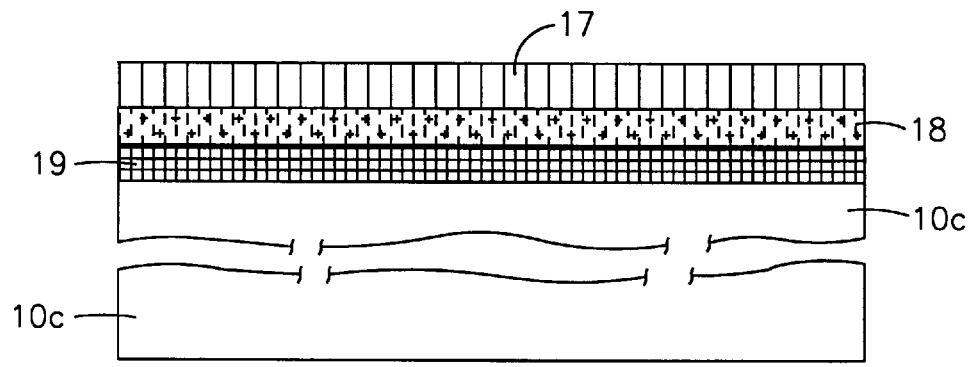
FIG. 2c shows a cross-section of a metallized silicon semiconductor substrate apparatus formed having tantalum ions being implanted into a tantalum barrier layer underlying copper interconnect leads.
Figure 2D:
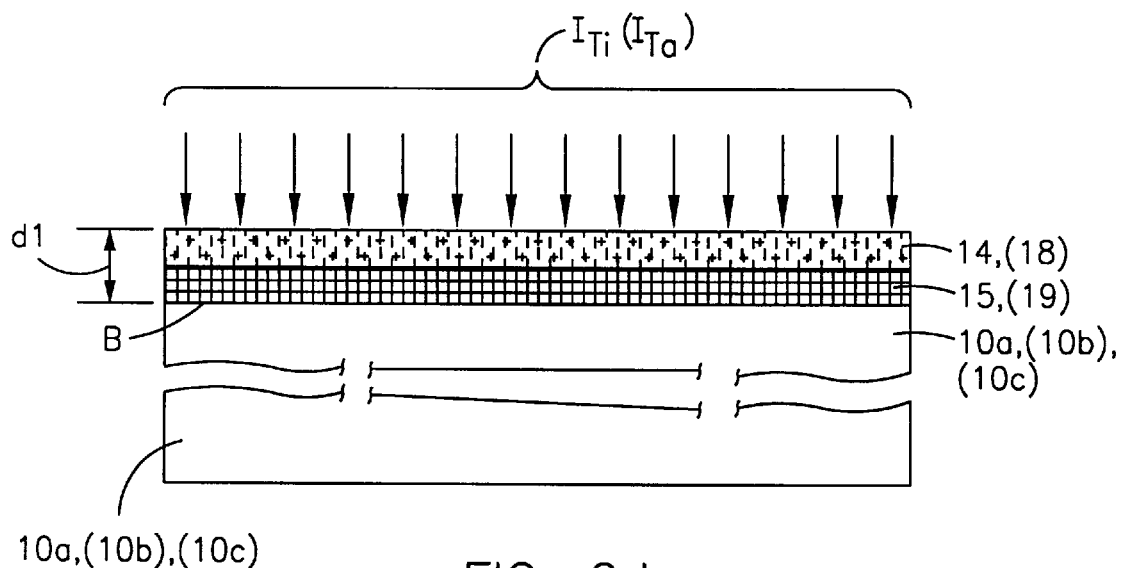
FIG. 2d shows a cross-section of a pre-metallized silicon semiconductor substrate apparatus undergoing a normal-oriented titanium, (tantalum) ion implantation process to produce an amorphous titanium (tantalum) barrier layer on the premetallized silicon substrate apparatus depicted in FIGS. 2a 2b, and 2c.
Figure 3:
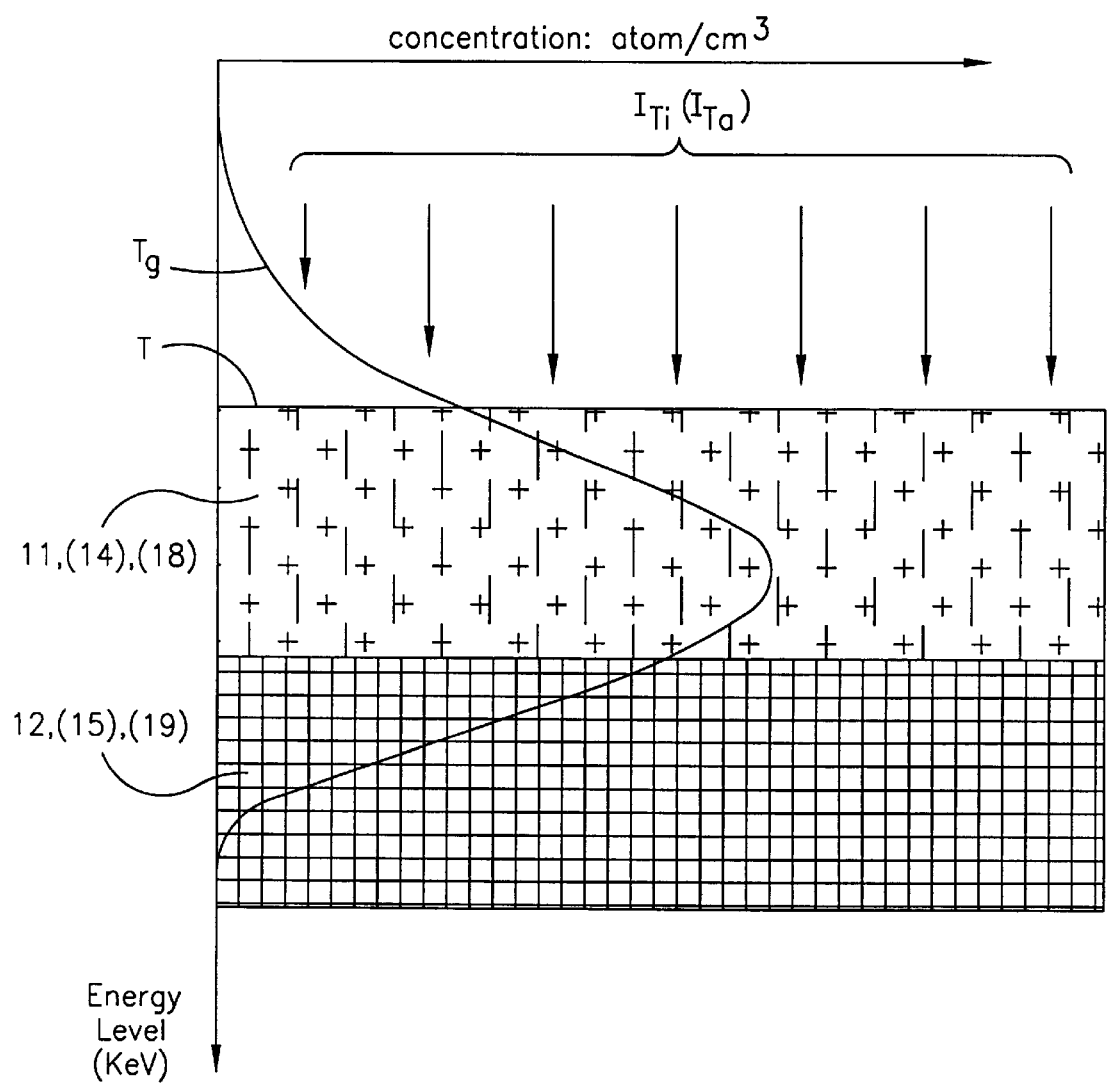
FIG. 3 is a dopant concentration plot showing the Gaussian implant energy distribution superimposed on a diagram for implanting titanium, or tantalum ions into a respective metal barrier layer.

As a preferred process, the object of the present invention are accomplished by an ion implantation fabrication process that forms on a silicon substrate apparatus 10, as depicted in FIG. 1, an amorphous metal barrier layer comprising a metal barrier ion 11 implanted into a same metal barrier layer 12. It should be noted that oxidized ($SiO_2$) silicon substrate apparatus 10, and other similar oxidized substrate apparatus, 10a, 10b, 10c, 10d, and 10e described below, are shown generally as pre-fabricated semiconductor circuit apparatus requiring a metallization layer. The ion implant 11 facilitates forming a non-crystalline metal structure in the metal barrier film 12 such that there is no crystalline metal to act as a "seed" for nucleation during the subsequent metallization deposition of interconnect 16 and 17 and subsequent processing. Thus, the final interconnect metallization Al aluminum texture 16 or copper Cu metal 17, depicted in generally in FIGS. 2a and 2b, will not be governed by the texture of the underlying metal barrier layer. By having the underlying barrier metal layer with an amorphous structure, then interconnection metallization deposition parameters can be chosen to minimize texture variations which will improve electromigration performance. The deposition processes, namely sputtering or chemical vapor deposition, being commonly used to deposit the metallization layer. By example, a common texture for aluminum can be a {111} structure. FIG. 2a shows a cross-section of a particular silicon semiconductor substrate apparatus 10a formed having titanium ions 14 implanted into a titanium barrier layer 15 underlying an aluminum metal layer 16 used for forming interconnect leads in the semiconductor apparatus. The process flow would be: deposit barrier 15, self-implant ions 14, Al deposition 16, heat treat to get optimum Al texture. Similarly, FIG. 2b shows a cross-section of another particular silicon semiconductor substrate apparatus 10b formed having titanium ions 14 implanted into a titanium barrier layer 15 underlying a copper metal layer 17 used for forming interconnect leads in the semiconductor apparatus. FIG. 2c shows a cross-section of yet another particular silicon semiconductor substrate apparatus 10c formed having tantalum ions 18 implanted into a tantalum barrier layer 19 underlying a copper metal layer 17 used for forming interconnect leads in the semiconductor apparatus. As depicted in FIG. 2d, the preferred fabrication process, in accordance with the present invention, comprises an ion implantation process, depicted with letter designations $I_{Ti}, (I_{Ta})$, that implants the barrier metal film 15, (19) prior to deposition of the Al, or Cu, metal layer 16, (17) with an ionic version 14, (18) of the barrier metal 15, (19). The irradiating energy KeV for a normal-oriented ion implant (normal with respect to the surface of the barrier metal) is determined in accordance with the thickness d1 and atomic number of the barrier metal being utilized. In general, and as depicted in FIG. 3, the energy for a desired dopant position in a barrier metal (11, 12), (14, 15) or (18, 19) is chosen such that the tail Tg of the Gaussian distribution of ion's stopping distances extends above the top T of the barrier metal film 11, (14), (18).

Although the foregoing discussion has been directed at using titanium and tantalum as barrier metals, other metals or metal compounds such as titanium nitride or titanium-tungsten, can be used provided they have a high melting point, and are sufficiently stable at ordinary metallization processing temperatures, typically 450° C., to remain amorphous. Table 1.0 below shows a list of metals and metal compounds having the requisite properties for being ion implanted to produce an amorphous structure.

TABLE 1.0

Barrier Metal/Metal Compound Properties

| Meta or metal compound 1 | Melting point (° C.) |
|---|---|
| tantalum | 3000 |
| titanium | 1800 |
| tungsten | 3370 |
| molybdenum | 2620 |
| nickel | 1455 |
| titanium nitride | ~2500 |
| titanium-tungsten | ~2500 |

Figure 4:
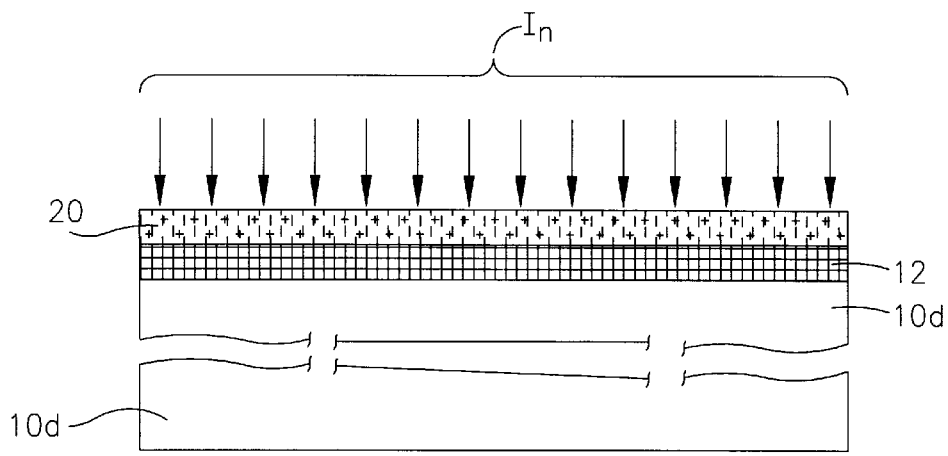
FIG. 4 shows generalized cross-section of a pre-metallized silicon semiconductor substrate apparatus having a barrier metal undergoing a normal-oriented nitrogen ion ($N^+$) implantation process to form an amorphous structure in the metal barrier, in accordance with the present invention.

In applications where one cannot implant a host metal ion into the metallized barrier, i.e., ($Ti^+$ into Ti) or ($Ta^+$ into Ta), then nitrogen ion $N^+$ implantation can be utilized as an alternative ion implant. The implanted barrier metal will still be a good electrical conductors and an amorphous structure is obtained such that a non-crystalline metal structure is formed in the metal barrier which cannot act as a "seed" for nucleation during the metallization deposition of an interconnect metal. FIG. 4 shows generalized cross-section of a silicon semiconductor substrate apparatus 10d having a barrier metal 12 undergoing a normal-oriented ion implantation $I_N$ of a nitrogen ion $N^+$ to form an amorphous structure 20 in metal barrier metal 12. The metal barrier may include those shown in the list of barrier metals (Table 1.0).

Figure 5:
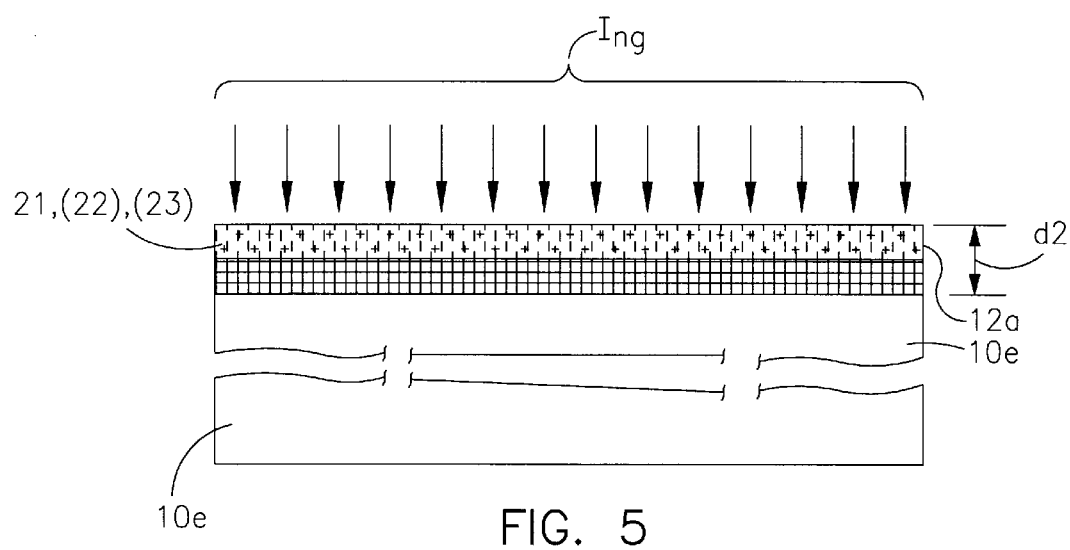
FIG. 5 is a generalized cross-section of a pre-metallized silicon semiconductor substrate apparatus having a barrier metal undergoing a normal-oriented implant to form an amorphous structure in the metal barrier, in accordance with the present invention, utilizing an implant species, other than self-implant or nitrogen implant, which are compatible with semiconductor processing, including a noble gas ion implant such as neon (Ne), argon (A), krypton (Kr) or xenon (Xe).

There are also other possibilities where a barrier metal, or metal compound maybe amorphized using other ion implant species. FIG. 5 is a generalized cross-section of a pre-metallized silicon semiconductor substrate apparatus 10e having a barrier metal 12a with a thickness d2. As depicted in FIG. 5, metal 12a is undergoing a normal-oriented implant of an implant species, other than self-implant or nitrogen implant, which implant species are compatible with semiconductor processing and which include refractory metal ions or noble gas ion implant $I_{ng}$ selected from noble gases such as neon (Ne), argon (A), krypton (Kr) and xenon (Xe) to form an amorphous structure 21, or 22, or (23) in the metal barrier 12a, in accordance with the present invention.

Figure 6:
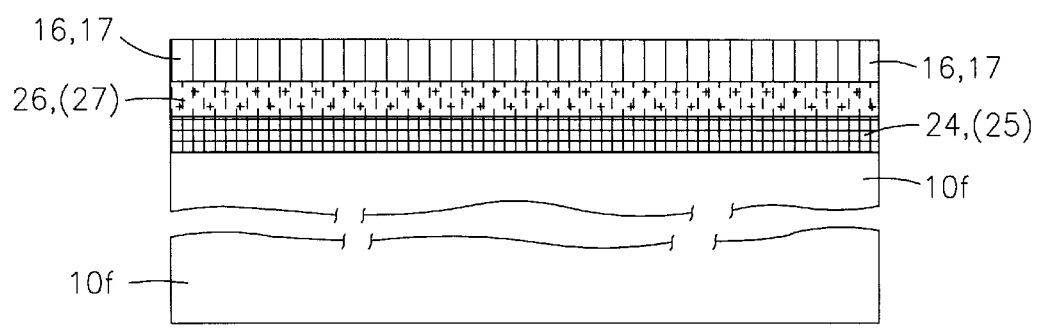
FIG. 6 shows a cross-section of an aluminum, or copper, metallized silicon semiconductor substrate apparatus formed having Ti or W ions implanted into a titanium nitride (TiN), or titanium-tungsten (TiW), metal compound barrier layer for forming an amorphous structure in the metal compound barrier, in accordance with the present invention.

FIG. 6 shows a cross-section of a silicon semiconductor substrate apparatus 10f formed having metallized aluminum 16, or metallized copper 17, formed over an amorphous titanium nitride (TiN) structure 26, or amorphous titanium-tungsten (TiW) structure 27, which are formed by ion implantation of Ti or W into titanium nitride metal compound layer 24, or titanium-tungsten metal compound barrier layer 25.

The present invention has been particularly shown and described with respect to a certain preferred embodiment and features thereof. However, it should be readily apparent to those of ordinary skill in the art that various changes and modifications in the process steps, semiconductor material, and detail may be made without departing from the spirit and scope of the inventions as set forth in the appended claims. The inventions illustratively disclosed herein may be practiced without any element which is not specifically disclosed herein.

What is claimed is:

1. A method for improving electromigration performance characteristics in a semiconductor apparatus, said method comprising the steps of:
   (a) providing a semiconductor substrate having active regions for fabricating functional independent circuits requiring interconnecting metal structure;
   (b) selecting a barrier metal and forming a metal barrier layer over said active regions using said selected barrier metal prior to fabricating said interconnecting metal structure, said barrier metal having a crystalline structure;
   (c) implanting ions of said barrier metal into said formed barrier metal and physically transforming said crystalline structure to an amorphous structure; and
   (d) forming said interconnecting metal structure, said interconnecting metal structure being formed by depositing an interconnecting metal over said amorphous structured barrier metal formed in said step (c), said interconnecting metal being formed having an optimized metallization texture comprising a narrow distribution of crystallographic orientations of metal crystals comprising said interconnecting metal.

2. A method for improving electromigration performance characteristics in a semiconductor apparatus as described in claim 1, wherein:
   said step (b) comprises selecting titanium as said barrier metal and depositing said titanium metal over said active region and forming a titanium barrier layer having a crystalline structure; and
   said step (c) comprises implanting at a predetermined energy and a predetermined concentration of titanium ions into said formed titanium barrier layer, said concentration being measured according to a Gaussian distribution relationship for implanting titanium ions to a desired depth.

3. A method for improving electromigration performance characteristics in a semiconductor apparatus as described in claim 2, wherein:

said step (d) comprises forming said metal interconnecting structure by depositing aluminum having an optimized metallization texture.

4. A method for improving electromigration performance characteristics in a semiconductor apparatus as described in claim 2, wherein:

said step (d) comprises forming said metal interconnecting structure by depositing copper having an optimized metallization texture.

5. A method for improving electromigration performance characteristics in a semiconductor apparatus as described in claim 1, wherein:

said step (b) comprises selecting tantalum as said barrier metal and depositing said tantalum metal over said active region and forming a tantalum barrier layer having a crystalline structure; and said step (c) comprises implanting at a predetermined energy and a predetermined concentration of tantalum ions into said formed tantalum barrier layer, said concentration being measured according to a Gaussian distribution relationship for implanting tantalum ions to a desired depth.

6. A method for improving electromigration performance characteristics in a semiconductor apparatus as described in claim 5, wherein:

said step (d) comprises forming said metal interconnecting structure by depositing copper having an optimized metallization texture.

7. A method for improving electromigration performance characteristics in a semiconductor apparatus, said method comprising the steps of:

(a) providing a semiconductor substrate having active regions for fabricating functional independent circuits requiring interconnecting metal structure;

(b) selecting titanium as a barrier metal and forming a titanium barrier layer over said active regions using said titanium prior to fabricating said interconnecting metal structure, said titanium barrier layer having a crystalline structure;

(c) implanting titanium ions into said formed titanium barrier layer and physically transforming said crystalline structure to an amorphous structure; and (d) forming said interconnecting metal structure, said interconnecting metal structure being formed by depositing an interconnecting metal over said amorphous structured titanium barrier layer formed in said step (c), said interconnecting metal being formed having an optimized metallization texture comprising a narrow distribution of crystallographic orientations of metal crystals comprising said interconnecting metal.

8. A method for improving electromigration performance characteristics in a semiconductor apparatus as described in claim 7, wherein:

said step (d) comprises forming said metal interconnecting structure by depositing aluminum having an optimized metallization texture.

9. A method for improving electromigration performance characteristics in a semiconductor apparatus as described in claim 7, wherein:

said step (d) comprises forming said metal interconnecting structure by depositing copper having an optimized metallization texture.

10. A method for improving electromigration performance characteristics in a semiconductor apparatus, said method comprising the steps of:

(a) providing a semiconductor substrate having active regions for fabricating functional independent circuits requiring interconnecting metal structure;

(b) selecting a barrier metal and forming a barrier metal layer over said active regions using said selected barrier metal prior to fabricating said interconnecting metal structure, said barrier metal layer having a crystalline structure;

(c) implanting nitride $N^+$ ions into said formed barrier metal layer and physically transforming said crystalline structure to an amorphous structure; and (d) forming said interconnecting metal structure, said interconnecting metal structure being formed by depositing an interconnecting metal over said amorphous structured barrier metal layer formed in said step (c), said interconnecting metal being formed having an optimized metallization texture comprising a narrow distribution of crystallographic orientations of metal crystals comprising said interconnecting metal.

11. A method for improving electromigration performance characteristics in a semiconductor apparatus, said method comprising the steps of:

(a) providing a semiconductor substrate having active regions for fabricating functional independent circuits requiring interconnecting metal structure;

(b) selecting a barrier metal and forming a barrier metal layer over said active regions using said selected barrier metal prior to fabricating said interconnecting metal structure, said barrier metal layer having a crystalline structure capable of being formed having an amorphous structure by implanting an ion implant;

(c) selecting said ion implant from a group of ion implant species consisting of noble gas ions, aluminum ($Al^+$) ions, and copper ($Cu^+$) ions and implanting said selected ion implant specie into said formed barrier metal layer and physically transforming said crystalline structure to an amorphous structure; and (d) forming said interconnecting metal structure, said interconnecting metal structure being formed by depositing an interconnecting metal over said amorphous structured barrier metal layer formed in said step (c), said interconnecting metal being formed having an optimized metallization texture comprising a narrow distribution of crystallographic orientations of metal crystals comprising said interconnecting metal.

12. A semiconductor apparatus having interconnecting lead structure optimized for lifetime electromigration performance, said apparatus comprising:

a semiconductor substrate having active regions for fabricating functional independent circuits requiring interconnecting metal structure;

a barrier metal layer formed over said active regions, said barrier metal layer having same-metal ions implanted into said barrier metal layer that facilitate said barrier metal layer having an amorphous structure; and an interconnecting metal structure, said interconnecting metal structure being formed over said amorphous structured barrier metal, said interconnecting metal having a metallized texture comprising a narrow distribution of crystallographic orientations of metal crystals.

13. A method for improving electromigration performance characteristics in a semiconductor apparatus, said method comprising the steps of:

(a) providing a semiconductor substrate having active regions for fabricating functional independent circuits requiring interconnecting metal structure;

(b) selecting a barrier metal compound and forming a metal compound barrier layer over said active regions using said selected barrier metal compound prior to fabricating said interconnecting metal structure, said barrier metal compound having a crystalline structure;

(c) implanting ions selected from a group of ions consisting of Ti and W ions into said formed barrier metal compound and physically transforming said crystalline structure to an amorphous structure; and (d) forming said interconnecting metal structure, said interconnecting metal structure being formed by depositing an interconnecting metal over said amorphous structured barrier metal compound formed in said step (c), said interconnecting metal being formed having an optimized metallization texture comprising a narrow distribution of crystallographic orientations of metal crystals comprising said interconnecting metal.

14. A method for improving electromigration performance characteristics in a semiconductor apparatus as described in claim 13, wherein:

said step (b) comprises selecting titanium nitride as said barrier metal compound and depositing said titanium nitride metal compound over said active region and forming a titanium nitride barrier layer having a crystalline structure; and said step (c) comprises implanting at a predetermined energy and a predetermined concentration of Ti ions into said formed titanium nitride barrier layer, said concentration being measured according to a Gaussian distribution relationship for implanting Ti ions to a desired depth.

15. A method for improving electromigration performance characteristics in a semiconductor apparatus as described in claim 14, wherein:

said step (d) comprises forming said metal interconnecting structure by depositing aluminum having an optimized metallization texture.

16. A method for improving electromigration performance characteristics in a semiconductor apparatus as described in claim 14, wherein:

said step (d) comprises forming said metal interconnecting structure by depositing copper having an optimized metallization texture.

17. A method for improving electromigration performance characteristics in a semiconductor apparatus as described in claim 13, wherein:

said step (b) comprises selecting titanium-tungsten as said barrier metal compound and depositing said titanium-tungsten metal compound over said active region and forming a titanium-tungsten barrier layer having a crystalline structure; and said step (c) comprises implanting at a predetermined energy and a predetermined concentration of ions selected from a group of ions consisting of Ti and W ions into said formed titanium-tungsten barrier layer, said concentration being measured according to a Gaussian distribution relationship for implanting said selected ions to a desired depth.

18. A method for improving electromigration performance characteristics in a semiconductor apparatus as described in claim 17, wherein:

said step (d) comprises forming said metal interconnecting structure by depositing copper having an optimized metallization texture.

19. A method for improving electromigration performance characteristics in a semiconductor apparatus as described in claim 17, wherein:

said step (d) comprises forming said metal interconnecting structure by depositing aluminum having an optimized metallization texture.

* * * * *